US011810766B2

(12) United States Patent
Balaraman et al.

(10) Patent No.: US 11,810,766 B2
(45) Date of Patent: Nov. 7, 2023

(54) PROTECTION OF ALUMINUM PROCESS CHAMBER COMPONENTS

(71) Applicant: Applied Materials, Inc., Santa Clara, CA (US)

(72) Inventors: Karthikeyan Balaraman, Bangalore (IN); Sathyanarayana Bindiganavale, Bengaluru (IN); Rajasekhar Patibandla, Bangalore (IN); Balamurugan Ramasamy, Bangalore (IN); Kartik Shah, Saratoga, CA (US); Umesh M. Kelkar, Santa Clara, CA (US); Mats Larsson, Sunnyvale, CA (US); Kevin A. Papke, Portland, OR (US); William M. Lu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 250 days.

(21) Appl. No.: 16/401,871

(22) Filed: May 2, 2019

(65) Prior Publication Data
US 2020/0013589 A1    Jan. 9, 2020

Related U.S. Application Data

(60) Provisional application No. 62/694,305, filed on Jul. 5, 2018.

(51) Int. Cl.
*H01J 37/32* (2006.01)
*H01L 21/687* (2006.01)
(Continued)

(52) U.S. Cl.
CPC .... *H01J 37/32477* (2013.01); *C23C 14/0641* (2013.01); *C23C 14/16* (2013.01);
(Continued)

(58) Field of Classification Search
CPC ... C23C 14/16; C23C 14/0617; C23C 14/024; C23C 14/0641; C23C 16/4404;
(Continued)

(56) References Cited

U.S. PATENT DOCUMENTS 5,342,652 A * 8/1994 Foster ............... C23C 16/0218
257/E21.17
6,007,909 A * 12/1999 Rolander ............... C23C 30/005
428/336
(Continued)

FOREIGN PATENT DOCUMENTS

WO    2005083154 A2    9/2005

OTHER PUBLICATIONS

Ishigaki et al. "Influence of the Al content on mechanical properties of CVD aluminum titanium nitride coatings," International Journal of Refractory Metals and Hard Materials, 71 (2018) p. 227-231 available online Nov. 22, 2017 (Year: 2017).*

(Continued)

*Primary Examiner* — Parviz Hassanzadeh
*Assistant Examiner* — Margaret Klunk
(74) *Attorney, Agent, or Firm* — Patterson + Sheridan, LLP

(57) ABSTRACT

Embodiments of the present disclosure are directed towards a protective multilayer coating for process chamber components exposed to temperatures from about 20° C. to about 300° C. during use of the process chamber. The protective multilayer coating comprises a bond layer and a top layer, the bond layer is formed on a chamber component to reduce the stress between the top layer and the chamber component. The reduced stress decreases or prevents particle shedding from the top layer of the multilayer coating during and after use of the process chamber. The bond layer comprises
(Continued)

titanium, titanium nitride, aluminum, or combinations thereof, and the top layer comprises tungsten nitride.

20 Claims, 6 Drawing Sheets

(51) Int. Cl.
    *C23C 16/34* (2006.01)
    *C23C 14/06* (2006.01)
    *C23C 16/06* (2006.01)
    *C23C 14/16* (2006.01)

(52) U.S. Cl.
    CPC .............. *C23C 16/06* (2013.01); *C23C 16/34* (2013.01); *H01L 21/68757* (2013.01)

(58) Field of Classification Search
    CPC ..... C23C 16/4401; C23C 16/34; C23C 16/06; C04B 35/58007; H01L 21/68757
    See application file for complete search history.

(56) References Cited

U.S. PATENT DOCUMENTS

| | | | |
|---|---|---|---|
| 6,139,700 A | 10/2000 | Kang et al. | |
| 6,280,862 B1* | 8/2001 | Inokuti | C21D 8/1288 148/110 |
| 2002/0066532 A1* | 6/2002 | Shih | H01J 37/32477 156/345.1 |
| 2002/0086110 A1 | 7/2002 | Vercammen et al. | |
| 2002/0102858 A1* | 8/2002 | Wicker | H01J 37/32477 438/731 |
| 2003/0198587 A1* | 10/2003 | Kaloyeros | C01B 21/062 423/409 |
| 2006/0086458 A1* | 4/2006 | Kim | H01J 37/32477 156/345.1 |
| 2006/0137970 A1* | 6/2006 | Ahn | H01J 37/3447 204/192.15 |
| 2007/0059460 A1* | 3/2007 | Abney | B21D 22/16 428/34.1 |
| 2010/0086805 A1* | 4/2010 | Lin | C23C 28/44 428/653 |
| 2011/0186420 A1* | 8/2011 | Shi | C23C 14/025 204/192.12 |
| 2011/0310524 A1* | 12/2011 | Six | G03F 7/70783 361/234 |
| 2014/0083387 A1* | 3/2014 | Cha | F16K 27/00 427/576 |
| 2017/0145553 A1* | 5/2017 | Liu | C23C 18/48 |
| 2018/0016675 A1* | 1/2018 | Krassnitzer | H01J 37/32477 |
| 2019/0078200 A1* | 3/2019 | Wu | C23C 16/403 |

OTHER PUBLICATIONS

PCT/US2019/035180, International Search Report/Written Opinion dated Sep. 23, 2019, 9 pages.

Office Action for Taiwan Application No. 108123770 dated Feb. 3, 2023.

Search Report for Taiwan Application No. 108123770 dated Jan. 17, 2023.

* cited by examiner

PROTECTION OF ALUMINUM PROCESS CHAMBER COMPONENTS

PRIORITY CLAIM

This application claims priority to U.S. Provisional Application No. 62/694,305, "Protection of Aluminum Process Chamber Components," filed Jul. 5, 2018, incorporated herein by reference in its entirety.

BACKGROUND

Field

Embodiments of the present invention generally relate to the operation of a process chamber.

Description of the Related Art

Semiconductor and electronic devices are fabricated in process chambers that experience temperatures from room temperature to over 400° C. During high temperature applications, some of which are accompanied by high pressure as well, components of the process chambers can form undesirable particulate matter that can cause defects or otherwise reduced performance of the devices fabricated in the process chamber. The particles are formed when the interior components of the chamber crack, wear, or otherwise degrade during use. This degradation additionally reduces the life of the components and leads to downtime and maintenance costs. Coatings used to protect aluminum components in process chambers can also exhibit wearing and can contaminate the process chamber as well as products fabricated in the process chamber.

Thus, there remains a need in the art for a method of reducing or preventing particulate contamination in process chambers.

SUMMARY

Systems and methods herein are associated with protective coatings for process chamber components. In one example, a method of forming a coating includes: forming a first layer on a chamber component, wherein the first layer is formed from titanium nitride (TiN); and forming a second layer on the first layer, wherein the second layer is formed from tungsten nitride ($W_2N$).

In another example, a device includes: a chamber component; and a multilayer coating. The multilayer coating includes a first layer of TiN formed over the chamber component; and a second layer of $W_2N$ formed over the first layer.

In another example, a method of forming a coating, includes: forming a first layer on a chamber component to a thickness from about 50 microns to about 200 microns. The first layer includes titanium nitride (TiN). Further in the method, during the forming, a temperature of the chamber component is from 20° C. to 300° C. Furthermore in this example method, the method includes forming a second layer on the first layer to a thickness from about 200 microns to 400 microns, wherein the second layer is formed from tungsten nitride ($W_2N$).

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
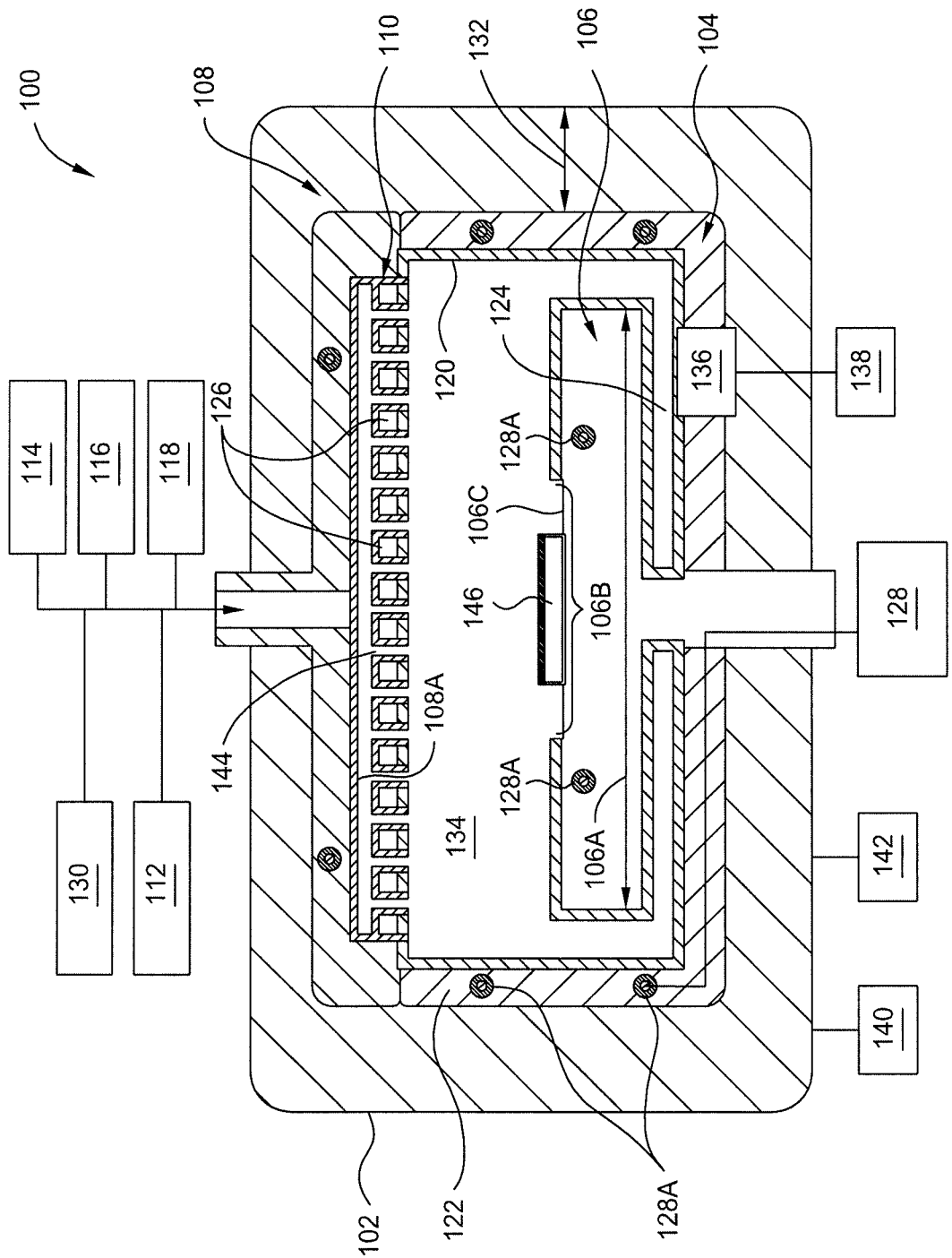
FIG. 1 is a cross-sectional view of an example process chamber according to embodiments of the present disclosure.

Semiconductor device fabrication includes various operations for material deposition and material removal and patterning operations that are performed at high temperatures (300° C. or higher) and, in some examples, using harsh etchant gases and gas mixtures. Interior components of a process chamber can be fabricated from a plurality of materials, including nickel superalloys, stainless steel, quartz, aluminum, or other materials configured to withstand various processing conditions. To protect the interior components of process chambers such as showerheads, liners, substrate support pedestals, and other components, collectively referred to herein as "chamber components," a protective coating can be used. In some examples, tungsten nitride ($W_2N$) is used as a protective coating. However, just as interior components can degrade without protective coatings, the same harsh environments of process chambers can cause protective coatings to exhibit undesired particle formation. Particle formation, which leads to particle shedding where particles of a coating fall from the coated component(s) and contaminate the device and/or the chamber, occurs because the coated interior components experience surface cracking, wear, or diffusion after exposure to high temperatures and/or pressures during operation of the process chamber. Particle shedding can cause killer defects or reduced performance of final devices, and can reduce the life of process chamber components. The tendency of a coating to shed particles can be due in part to a stress of the layer or layers of the coating shedding the particles because of a residual stress in the coating due at least in part to its deposition on the underlying chamber component. Coatings that exhibit higher stresses than a predetermined allowable stress are more likely to shed than coatings that are under the predetermined allowable stress threshold, which may vary among and between semiconductor devices. As semiconductor devices continue to have smaller line widths and other dimensions, in some examples on the order of less than 10 nm, the particles shed from the interior components of the process chamber can lead to a large number of defects in the semiconductor devices.

As discussed in embodiments herein, a protective multilayered coating is applied to interior components of a process chamber, such as those components that can be fabricated from aluminum, including chamber liners used for walls, substrate support pedestals, and showerheads. The protective multilayered coating for these components reduces or eliminates particle shedding, extending the life of the chamber components and reducing the defective products and scrap caused by the particle shedding. The multilayered protective coating includes at least two layers, a first layer referred to as a bond layer and a second layer, a top layer, formed over the first layer. The bond layer is formed on one or more chamber components, as discussed herein, which can include interior components of a process chamber such as those chamber components formed of aluminum. The bond layer reduces the stress between the chamber component and the top layer, which decreases the likelihood of particle shedding from the top layer during use of the process chamber.

In an embodiment, the bond layer includes titanium (Ti), titanium nitride (TiN) and/or, in some examples, aluminum (Al), and the top layer includes tungsten nitride ($W_2N$). The protective multilayer coating acts as a thermal barrier and as a diffusion barrier with improved adhesion as compared to conventional coatings to better protect the interior components during process chamber operations at temperatures of 300° C. or more. In one example, a stress of the top layer when formed directly on an aluminum chamber component is about 25% higher than a top layer formed on a bond layer when the bond layer is formed on the aluminum chamber component. In another example, the bond layer of the multilayer coating reduces the stress of the second layer of the multilayer coating from 15% to 60%, as compared to the stress of the second layer if the second layer is formed directly on the chamber component. In an embodiment, a stress of the multilayer layer coating, e.g., a stress of each of the layers of the multilayer coating is less than a yield strength of the multilayer coating in the case of ductile materials or less than the ultimate strength in the case of brittle materials. These relative stresses further contribute to the adhesion of the multilayer coating on the chamber component during use of the process chamber. As discussed herein, the yield strength of the multilayer coating is the stress above which permanent deformation of the material (coating) occurs and above ultimate strength the material strength degrades or subjected to failure.

In an example, when the yield strength or ultimate strength is exceeded, the material performance degrades from predefined function by attaining plastic state or failure. Process chamber coatings on interior process chamber components can crack, shed, or otherwise form particular matter than can contaminate devices as well as other parts of the process chamber or a substrate positioned in the process chamber. In one example, the yield strength of Aluminum (Al) is +276 MPa, the ultimate strength of Titanium Nitride (TiN) is −972 MPa, and the ultimate strength of Tungsten Nitride ($W_2N$) is +700 MPa. The positive and negative signs represents the tensile (+) and compressive (−) strengths, respectively. Thus, the stresses of individual layers at each coating stages is targeted herein to be less than respective yield strength or ultimate strength of the material.

The multilayer coating discussed herein can be formed on chamber components including aluminum and aluminum alloys, for example, Al6061-T6. Aluminum and Al alloys can be used to form interior components used in process chambers such as the process chamber 100 when the process chamber 100 is held at from room temperature to about 300° C. As discussed herein, "room temperature" is from about 20° C. to about 25° C. The parts coated with the multilayer coating herein can be coated in-situ while assembled in a process chamber, or can be coated ex-situ at an original equipment manufacturer (OEM) or other manufacturer and assembled on-site, in some cases with one or more components that also include the multilayer coating. In other examples, the parts coated with the multilayer coating discussed herein can be coated and shipped to multiple locations where the chamber components are later assembled into process chambers. As discussed herein, the multilayer coating can include a bond layer formed as single layer in a deposition operation executed in a single pass or multiple passes. In another example, which can be combined with other examples herein, the bond layer can include a structure with two or more interlayers of different materials. In some examples, the bond layer is fabricated from one or more interlayers of Ti, TiN, and/or Al.

FIG. 1 is a cross-sectional view of an example process chamber 100 according to certain embodiments of the present disclosure. The process chamber 100 has a multilayer coating 120 formed according to certain embodiments of the present disclosure. The process chamber 100 includes an outer chamber body 102 formed around an inner chamber body 104. In an embodiment, the outer chamber body 102 includes aluminum and the inner chamber body 104 includes quartz, aluminum, or a nickel-based superalloy such as Hastelloy®. The inner chamber body 104 may be defined by chamber walls 122, a chamber bottom 124, and a chamber top 108A formed by a bottom surface of a chamber lid 108. In an embodiment, a vacuum is formed in a space 132 in between the outer chamber body 102 and the inner chamber body 104. In an embodiment, the chamber walls 122, the chamber bottom 124, the chamber top 108A, and additional components discussed herein may be formed from one or more materials such as stainless steel, quartz, nickel-based superalloy, or aluminum. The inner chamber body 104 is exposed to high temperatures, pressures, and, in some examples, etchant gases, which can corrode and degrade the inner chamber body 104 components. In one example, the process chamber 100 is coupled to a remote plasma source (RPS) 112, a gas panel 118, a condenser 114, and a steam generator 116.

In an embodiment during operation of the process chamber 100, the process chamber 100 can be pressurized and have the temperature controlled in various manners. In one example, the pressure within a processing space 134 is controlled using a throttle valve 136 situated between the inner chamber body 104 and a vacuum pump 138. The temperature at the surface of the chamber walls 122 is controlled using one or more heating elements 128A. The one or more heating elements 128A can be solid elements or liquid-containing elements that are located in the chamber walls 122 and/or the chamber lid 108 of the inner chamber body 104. In some examples, one or more heating elements 128A are positioned in a substrate support pedestal 106. In one example, the chamber lid 108 can be heated from 100° C. to 300° C. The plurality of heating elements 128A may be positioned in the chamber walls 122 of the inner chamber body 104 and electrically coupled to a power source 128. In the example in FIG. 1 the heating elements 128A are shown as two pairs of heating elements 128A positioned in or coupled to the chamber walls 122, one pair of heating elements 128A positioned in or coupled to the substrate support pedestal 106, and one pair of heating elements 128A positioned in or coupled to the chamber lid 108. In alternate embodiments, more or less heating elements 128A than illustrated in FIG. 1 may be employed in various configurations in the chamber walls 122, the chamber lid 108, and, in some embodiments, inside of or coupled to the substrate support pedestal 106. In one example of etching in the process chamber 100, chemically reactive ions are released from a plasma that can be introduced via the RPS 112 or formed in the process chamber 100 via other means as discussed below. The chemically reactive ions, once released from the plasma, strike a substrate 146 positioned on the substrate support pedestal 106, thereby removing exposed material from a surface of the substrate 146.

In another example of the process chamber 100, plasma can be generated using a RF source power 140 and an RF bias power 142. Each of the RF source power 140 and the RF bias power 142 is coupled to the process chamber 100 and configured to apply power, and in some examples pulses of power, to the chamber walls 122 and/or the substrate support pedestal 106. A negative bias can also be applied to the substrate support pedestal 106 in some examples. In one example, the gaseous mixture formed inside the processing space 134 from gas sources (not shown) coupled to the gas panel 118 is ignited into plasma by applying RF power from the RF source power 140 to a plurality of antenna segments (not pictured).

Further in the process chamber 100, a showerhead 110 is removably coupled to the process chamber 100 near the chamber top 108A. The showerhead 110 is used to distribute a plurality of gases, for example, gases supplied through the gas panel 118, in the inner chamber body 104. The showerhead 110 can be used to distribute gas and gas mixtures during substrate processing operations, or in other cleaning operations performed inside of the process chamber 100. The showerhead 110 may include a plurality of islands 126. A plurality of spaces 144 formed between each adjacent pair of islands 126. The islands 126 are connected (not shown here) such that gas flows through the showerhead 110 and into the processing space 134, in particular, the gas flows through the showerhead 110 in between the spaces 144 and into the processing space 134. In an embodiment, a multilayer coating 120 is formed as discussed herein, the multilayer coating is formed on surfaces of the showerhead 110 that are exposed to the gaseous components used to form the multilayer coating 120. In various embodiments, the multilayer coating 120 is also formed on the exposed surfaces of one or more of the inner chamber body 104, including the chamber walls 122, the chamber top 108A, the substrate support pedestal 106, and the chamber bottom 124, as well as any other chamber components fabricated from, for example, aluminum.

In an embodiment, a controller 130 is coupled to the process chamber 100 and configured to execute a plurality of instructions. In one example, the plurality of instructions executed by the controller 130 is associated with substrate processing, including layer deposition and patterning, as well as chamber cleaning. In another example, the plurality of instructions executed by the controller 130 is associated with forming the multilayer coating 120 on the chamber walls 122, the chamber bottom 124, the chamber top 108A, substrate support pedestal 106, and other exposed surfaces of the inner chamber body 104. In an embodiment, a protective cover (not shown) may be positioned on the substrate support pedestal 106 that covers some or all of a diameter 106A of the substrate support pedestal 106. Thus, a portion of the substrate support pedestal 106, shown as a region 106B in this example, is not coated with the multilayer coating 120 and remains exposed to the processing environment. In other examples, no protective cover is used on the substrate support pedestal 106, and the multilayer coating 120 is formed in the region 106B as well. The multilayer coating 120 may be formed from about 250 microns thick to about 600 microns thick.

During operation of the process chamber 100, subsequent to forming the multilayer coating 120 on one or more components that are assembled to form the process chamber 100, the substrate 146 is placed on the substrate support pedestal 106 in the uncoated region 106B of the substrate support pedestal 106. Gaseous components are supplied from a gas panel 118 to the process chamber 100 through the plurality of islands 126 of the showerhead 110, which act as entry ports for the gas. The one or more gaseous components are supplied simultaneously from the gas panel 118, or in an alternating and/or iterative fashion, to form a gaseous mixture in the processing space 134. The multilayer coating 120 can be removed by forming a F or $NF_3$ plasma in the process chamber 100 (or introducing the plasma via the RPS 112) via the showerhead 110 to remove the multilayer coating 120. The removal of the multilayer coating 120 can occur after one or more cycles in the process chamber, for example, after one or more films (not shown here) are formed on the substrate 146, or after a plurality of films are formed, or a plurality of films are patterned, or combinations thereof.

In an embodiment, during substrate 146 processing, the temperature of the substrate 146 positioned in the process chamber 100 is controlled by stabilizing the temperature of the substrate support pedestal 106. Additionally, helium or another gas is flowed from the gas panel 118 to a plenum (not shown) defined between the substrate 146, which is seated in the uncoated region 106B, and a support surface 106C of the substrate support pedestal 106. The helium gas is used to facilitate heat transfer between the substrate 146 and the substrate support pedestal 106. During a process in the process chamber 100, which can include an etch process, the substrate 146 is gradually heated by the plasma to a steady state temperature between 200° C. and 600° C. Using thermal control of both chamber top 108A and the substrate support pedestal 106, and in some cases, thermal control of the chamber walls 122, the substrate 146 is maintained at a predetermined temperature during processing. When the process chamber 100 is in use, the inner chamber body 104 is exposed to a harsh environment. The multilayer coating 120 thus protects the inner chamber body 104, preventing degradation of at least the chamber top 108A, bottom 124, chamber walls 122, showerhead 110, and substrate support pedestal 106. The multilayer coating 120 discussed herein can be formed on chamber components including aluminum and aluminum alloys, for example, Al6061-T6, on components that can be used in process chambers such as the process chamber 100 from room temperature to about 300° C.

Figure 2:
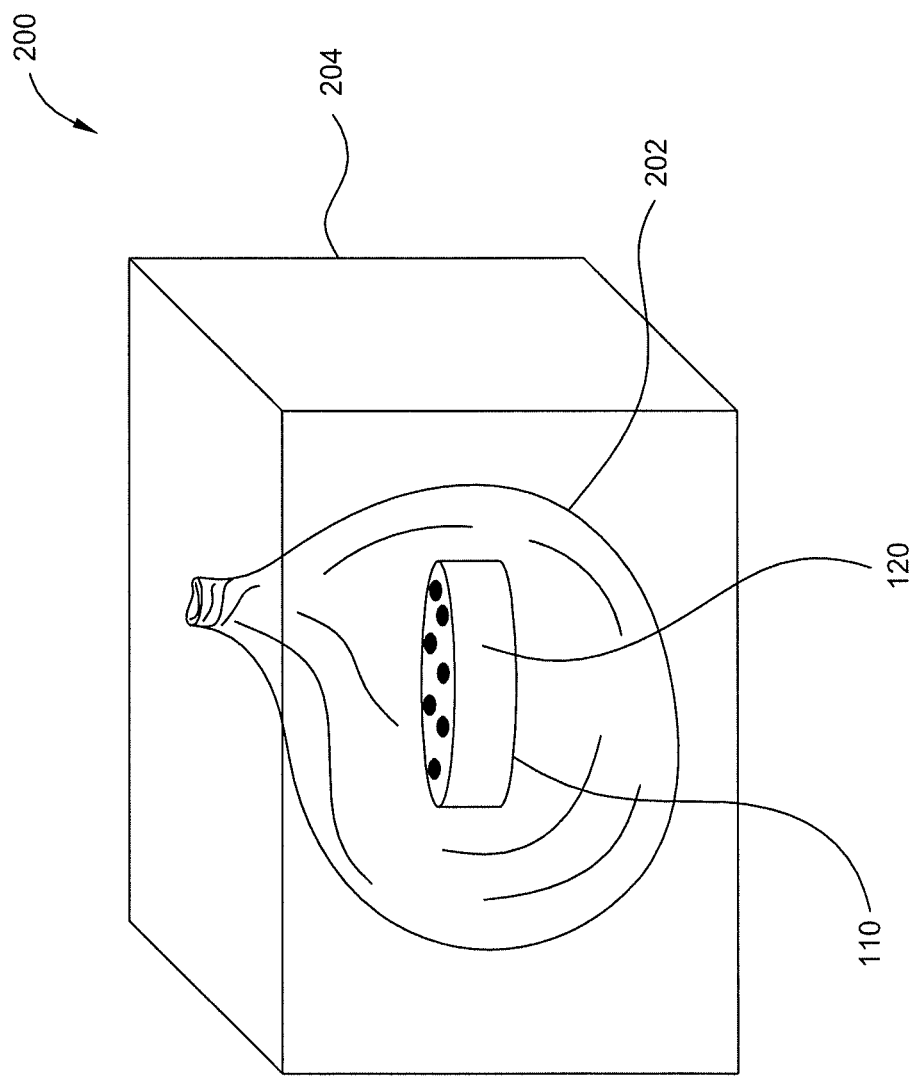
FIG. 2 is a schematic illustration of a component with a multilayer coating formed thereon according to embodiments of the present disclosure.

FIG. 2 is a schematic illustration 200 of a component with a multilayer coating formed thereon according to embodiments of the present disclosure. The multilayer coating 120 is shown in FIG. 1 as being formed on various components in the process chamber 100, and, may be, in various embodiments, formed on more or less components in other process chambers as compared to those shown in FIG. 2. In still other examples, the multilayer coating 120 can be formed on a single component such as the showerhead 110, as shown in FIG. 2. The showerhead 110 in FIG. 2 includes the multilayer coating 120, and is fabricated as discussed in embodiments of methods herein and then disposed in an inner shipper 202 such as a bag, box, envelope, or other protective container and further disposed in a shipping container 204. The showerhead 110 can thus be formed with the multilayer coating 120 thereon and positioned in a plurality of process chambers that are configured for a variety of device fabrication and processing operations. In other examples, other components such as substrate support pedestals and/or liners, or other aluminum components or other components, can be coated with the multilayer coating 120 and then distributed for assembly, in contrast to an example where one or more components are coated with the multilayer coating 120 in-situ, or coated and then assembled into a process chamber at the OEM. While a single showerhead 110 is shown in FIG. 2 as packaged and ready to ship, in alternate embodiments, two or more components can be positioned in the inner shipper 202, and two or more inner shippers 202 can be disposed in a shipping container 204.

Figure 3:
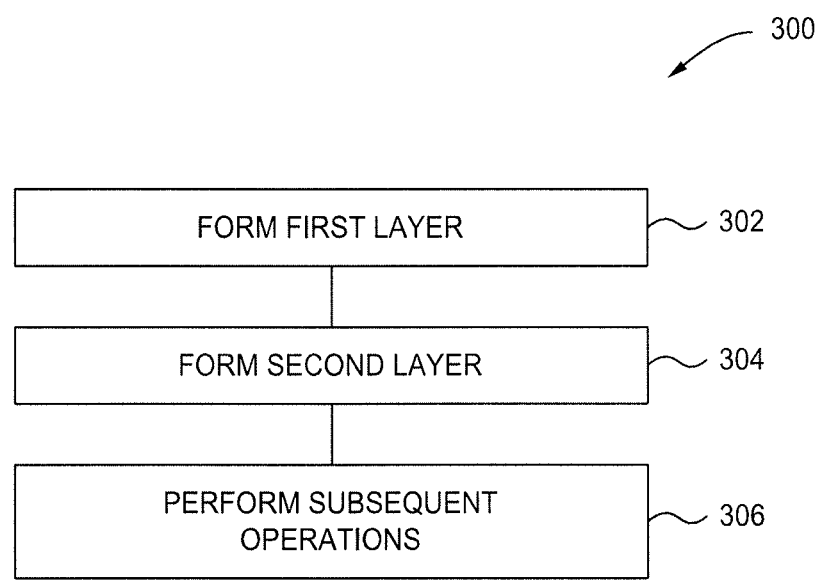
FIG. 3 is a method of forming a multilayer coating according to embodiments of the present disclosure.
Figure 4:
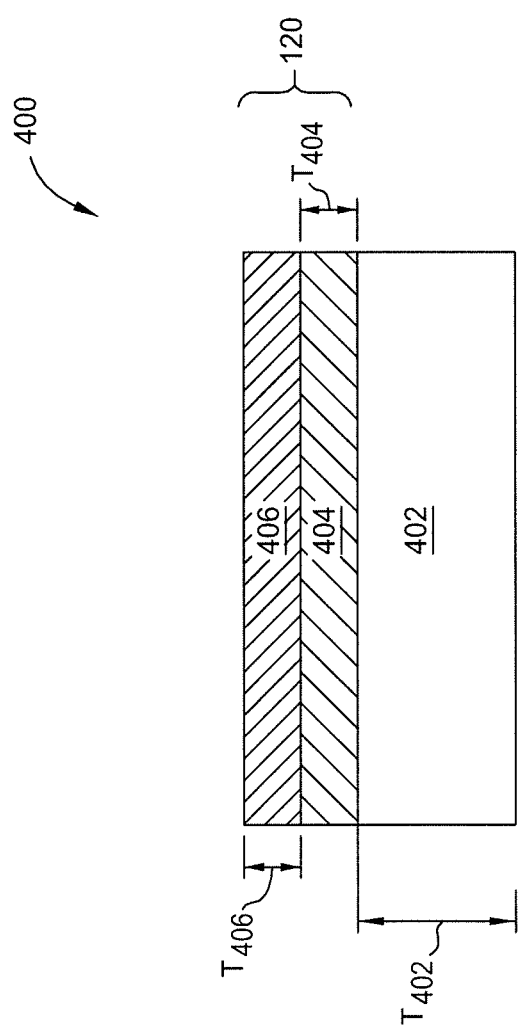
FIG. 4 is a partial schematic illustration of a cross-section of a chamber component that includes the multilayer coating formed thereon according to certain embodiments of the present disclosure.

FIG. 3 is a method 300 of forming a multilayer coating according to embodiments of the present disclosure. FIG. 4 is a partial schematic illustration of a cross-section of a coated chamber component 400 that includes the multilayer coating 120 disposed thereon. FIGS. 3 and 4 are discussed together below. In the method 300, at operation 302, a first layer 404 is formed on a chamber component 402 positioned in a process chamber. The first layer 404 can be in direct contact with the chamber component 402. The first layer 404 can be formed at operation 302 via PVD sputtering, ALD, CVD, or other methods when the chamber component is positioned in an appropriate process chamber for the applicable (PVD, ALD, or CVD) process. In one example, at operation 302, the first layer is formed in a CVD process chamber in the presence of $N_2$ and Ar gas using PVD sputtering. In this example, a process pressure of the $N_2$ and Ar gas in the process chamber is from $0.9 \cdot 10^{-1}$ Pa-$1.5 \cdot 10^{-1}$ Pa, a deposition temperature in the process chamber is from 20° C. to 350° C., a discharge voltage is from 400 V to 520 V, a discharge current is from 0.7 A to 1.3 A, and a partial pressure of $N_2$ is from $4.0 \cdot 10^{-3}$ Pa to $7.0 \cdot 10^{-3}$ Pa. In another example, a temperature during operation 302 is from 20° C. to 350° C. and can vary within this range during formation of the first layer 404.

In alternate embodiments, at operation 302, the first layer 404 is formed at operation 302 to a thickness $T_{302}$ from 50 microns to 200 microns thick, or from 75 microns thick to 150 microns thick, or from 95 microns to 130 microns thick. In one example, the first layer 404 comprises TiN, and can be formed using a TiN sputtering target or a Ti sputtering target and a nitrogen sputtering target. In another example, the first layer 404 comprises aluminum, or aluminum in combination with Ti or TiN, and an Al sputtering target is further employed to form the first layer 404. In an embodiment, a residual stress in the first layer 404 as-formed can be from about −1100 MPa to about −900 MPa. In some examples, the first layer 404 is formed at operation 302 to have a porosity level from 0% (no porosity) to 15% porosity, or from 1% to 10%, or less than 1%. As discussed herein, a percentage of porosity of a layer is a percentage of the volume of voids ($V_{voids}$) in the layer divided by the total volume of the layer ($V_{layer}$) such that the percentage of porosity of a layer can be expressed as $[(V_{voids}/V_{layer})*100]$. The residual stresses discussed herein are the stresses that remain in the layers as-formed, e.g., the stress remaining in the layer after the deposition on an underlying layer is completed. The first layer 404 can be formed to have a percentage of porosity greater than 0% (0.1%, 0.5%, or other values <1%) to obtain advantages including a lighter structure, a reduced material usage, ease of removal prior to re-coating, and/or an improved throughput.

At operation 304 in the method 300, a second layer 406 is formed on top of the first layer 404. The second layer 406 can be in direct contact with the first layer 404. The second layer 406 can be formed at operation 304 via PVD or CVD processes. In this example, a process pressure of the $N_2$ and Ar gas in the process chamber is from $0.9 \cdot 10^{-1}$ Pa-$1.5 \cdot 10^{-1}$ Pa, a deposition temperature in the process chamber is from 20° C. to 350° C., a discharge voltage is from 500 V to 700 V, a discharge current is from 0.4 A to 1.2 A, and a partial pressure of $N_2$ is from $6.0 \cdot 10^{-2}$ Pa to $9.0 \cdot 10^{-2}$ Pa. In other examples, a temperature in the process chamber is from 250° C. to 350° C. during operation 304. In an embodiment, the second layer 406 can be formed from $W_2N$. The second layer 406 can be formed from a sputtering target of $W_2N$ or from a target of W and a target of N. The first layer 404 acts to reduce the stress of the second layer 406, as compared to the stress of the second layer 406 as-deposited directly on the chamber component. The second layer 406 can be formed at operation 304 to a thickness $T_{406}$ from 200 microns to 500 microns, or from 300 microns to 400 microns. A thickness $T_{402}$ of the chamber component 402 can be from 1000 microns to 5000 microns. The thickness $T_{402}$ of the chamber component 402 can vary within the chamber component 402 based on its geometry. In one example, that can be combined with other examples herein, a residual stress of the second layer is from −600 MPa to −400 MPa. In one example, a ratio of thickness from the first layer 404 to the second layer 406 ($T_{404}:T_{406}$) is from 1:1 to 1:3.

In an embodiment, the first layer 404 reduces the residual stress on the second layer 406 after the second layer 406 is deposited at operation 304 by about 15% to 60% as compared to when the second layer 406 is deposited on and in contact with the chamber component 402 without the bond layer such as first layer 404. At operation 306, subsequent to forming the top layer at operation 304, subsequent operations can occur after the multilayer coating has been formed on the chamber component at operations 302 and 304. In some examples, the operation(s) 306 includes assembling the coated chamber components into a process chamber as shown in FIG. 1. In other examples, the operation(s) 306 include packaging operations such that the coated chamber component is packaged, for example, as shown in FIG. 2, and sent for subsequent processing including assembly into a process chamber at a separate facility from where the chamber component was coated with the multilayer coating. Subsequent to use of the chamber components that include the multilayer coating of the first layer 404 and the second layer 406, the coating can be removed. Depending upon the example, the multilayer coating of the first layer 404 and the second layer 406 can be removed by one or more of grit-blasting, chemical stripping using one or more acids, abrasive waterjet, micro-blasting, and/or machining, after which point the multi-layer coating can be reapplied via the method 300.

Figure 5A:
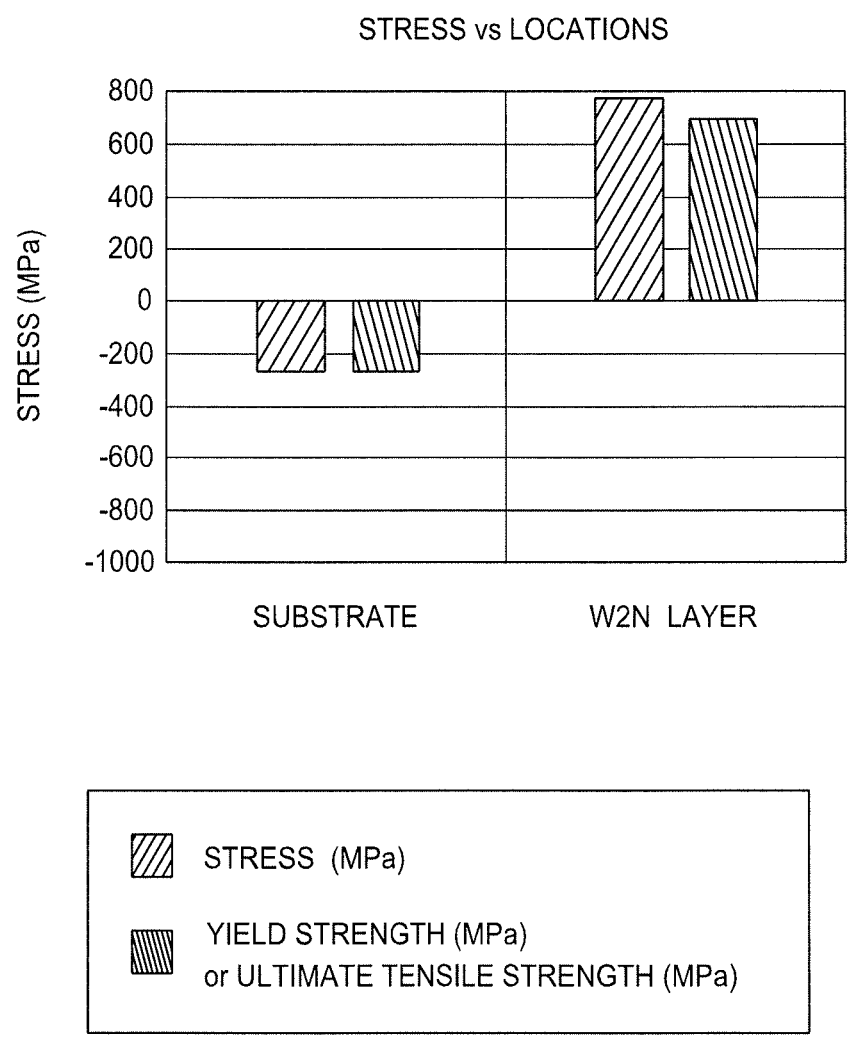
FIG. 5A is a graph of a conventional coating structure and a structure according to embodiments of the present disclosure.
Figure 5B:
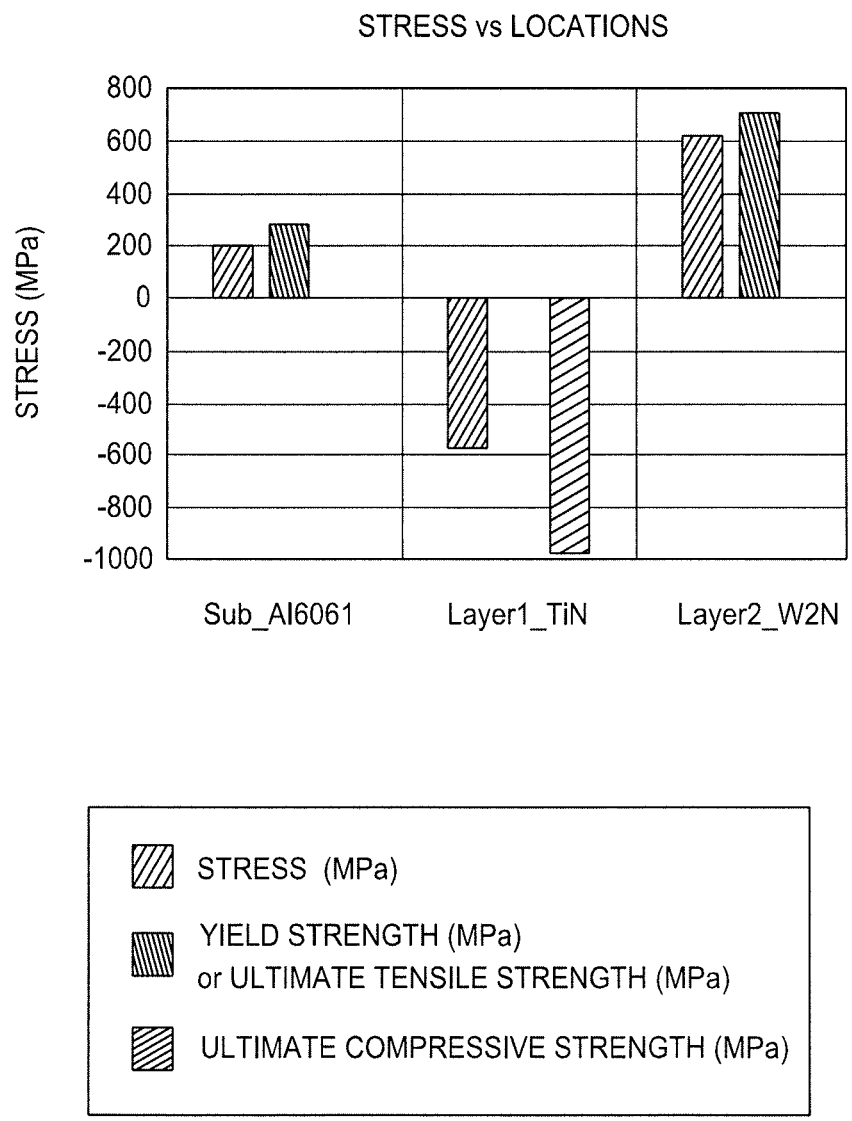
FIG. 5B is a graph of a conventional coating structure and a structure according to embodiments of the present disclosure.

FIGS. 5A and 5B are graphs of a conventional coating structure and a structure according to embodiments of the present disclosure. FIG. 5A shows stress graph of a structure that includes a chamber component that has a $W_2N$ layer formed thereon. The residual stress of the $W_2N$ layer is about 800 MPa when the $W_2N$ layer is formed directly on the chamber component, which includes aluminum. The yield strength of the chamber component is also shown in FIG. 5A and is about −250 MPa, as is the ultimate strength of W$_2$N which is about +700 MPa. In contrast, FIG. 5B shows the residual stresses of a structure including a chamber component with a TiN bond layer formed thereon, and a W$_2$N layer formed on the TiN bond layer. As shown in FIG. 5B, the TiN layer reduces the residual stress in the W$_2$N layer to 600 MPa, a 25% reduction from FIG. 5A. The chamber component of the structure in FIG. 5B exhibits a residual stress of 200 MPa, increased from −250 MPa as compared to when the W$_2$N layer is formed directly on the chamber component, as well as an increased yield strength of about 275 MPa as compared to the chamber component in FIG. 5A which exhibits about a −250 MPa yield strength. The reduced residual stress on the W$_2$N layer as shown in the graph in FIG. 5B leads to an increased life of the multilayer coating, less particle shedding, and higher yields from the fabrication process. The TiN layer, as compared to the W$_2$N layer, has less variation in its expansion coefficient and Young's modulus as compared to aluminum.

Thus, using the systems and methods discussed herein, a multilayer coating includes a bond layer of TiN and a top layer of W$_2$N reduces the stress on the top layer of the multilayer coating. The lower the stress, the lower the peeling/particle shedding, and, thus, the better the adhesion, so the use of the multilayer coating discussed herein improves the life of the coated part(s) as well as the product quality of devices fabricated in process chambers containing the coated part(s), due to the decreased likelihood and extent of particle shedding from the multilayer coating.

While the foregoing is directed to embodiments of the present disclosure, other and further embodiments of the disclosure may be devised without departing from the basic scope thereof, and the scope thereof is determined by the claims that follow.

What is claimed is:

1. A coated chamber component comprising:
    a chamber component configured to be used in a processing volume of a chamber, the chamber component comprising an aluminum alloy; and
    a multilayer coating having a thickness of 250 microns to 600 microns, comprising:
        a first layer comprising titanium nitride disposed on and in contact with the chamber component; and
        a second layer comprising tungsten nitride disposed on and in contact with the first layer, wherein a ratio of thickness of the first layer to thickness of the second layer is 1:1 to 1:3, wherein the second layer has an internal tensile stress, wherein the first layer has an internal compressive stress, and wherein the chamber component has an internal tensile stress.

2. The coated chamber component of claim 1, wherein the first layer further comprises aluminum (Al).

3. The coated chamber component of claim 1, wherein the first layer has a volumetric porosity from 1% to 20%.

4. The coated chamber component of claim 1, wherein the chamber component has a thickness from 2000 microns to 5000 microns thick.

5. The coated chamber component of claim 1, wherein the first layer is from 100 microns to 150 microns thick.

6. The coated chamber component of claim 1, wherein the second layer is from 250 microns to 320 microns thick.

7. The coated chamber component of claim 1, wherein the first layer comprises a residual stress from about −900 MPa to about −1100 MPa.

8. The coated chamber component of claim 1, wherein the second layer comprises a residual stress from about −400 MPa to about −600 MPa.

9. The coated chamber component of claim 1, wherein the first layer is from a thickness of 50 microns to 200 microns.

10. The coated chamber component of claim 1, wherein the second layer a thickness of 200 microns to 400 microns.

11. The coated chamber component of claim 1, wherein the coated chamber component is a chamber wall liner, a substrate support pedestal, or a showerhead.

12. The coated chamber component of claim 1, wherein the second layer of the multilayer coating comprises a residual stress of 15% to 60% less than the second layer if it were disposed directly on the chamber component.

13. A method of forming a coating, comprising:
    forming a multilayer coating on a chamber component configured to be used in a processing volume of a chamber, the chamber component comprising an aluminum alloy, the multilayer coating having a thickness of 250 microns to 600 microns, the forming of the multilayer coating comprising:
        forming a first layer disposed on and in contact with the chamber component, comprising titanium nitride (TiN); and
        forming a second layer disposed on and in contact with the first layer comprising tungsten nitride (W$_2$N), wherein a ratio of thickness of the first layer to thickness of the second layer is 1:1 to 1:3, wherein the second layer of the multilayer coating comprises a residual stress of 15% to 60% less than the second layer if it were disposed directly on the chamber component, and the second layer has an internal tensile stress, wherein the first layer has an internal compressive stress, and wherein the chamber component has an internal tensile stress.

14. The method of claim 13, wherein forming the first layer comprises using atomic layer deposition (ALD), chemical vapor deposition (CVD), or physical vapor deposition (PVD), and wherein forming the second layer comprises using PVD or CVD.

15. The method of claim 13, wherein the first layer has a thickness from about 50 microns to about 200 microns.

16. The method of claim 13, wherein the second layer has a thickness from about 200 microns to 400 microns.

17. The method of claim 13, wherein the first layer comprises a residual stress from about −900 MPa to about −1100 MPa and the second layer comprises a residual stress from about −400 MPa to about −600 MPa.

18. The method of claim 13, wherein, during the forming of the multilayer coating, a temperature of the chamber component is from 180° C. to 220° C.

19. A method of forming a coating, comprising:
    forming a multilayer coating on a chamber component configured to be used in a processing volume of a chamber, the chamber component comprising an aluminum alloy, the multilayer coating having a thickness of 250 microns to 600 microns, wherein, during the forming a temperature of the chamber component is from 20° C. to 300° C., the forming of the multilayer coating comprising:
        forming a first layer disposed on and in contact with the chamber component to a thickness from about 50 microns to about 200 microns, wherein the first layer comprises titanium nitride (TiN); and
        forming a second layer disposed on and in contact with the first layer to a thickness from about 200 microns to 400 microns, wherein the second layer comprises tungsten nitride ($W_2N$), wherein a ratio of thickness of the first layer to thickness of the second layer is 1:1 to 1:3, wherein the second layer of the multilayer coating comprises a residual stress of 15% to 60% less than the second layer if it were disposed directly on the chamber component, and the second layer has an internal tensile stress, wherein the first layer has an internal compressive stress, and wherein the chamber component has an internal tensile stress.

20. The method of claim 19, wherein the first layer comprises a residual stress from about −900 MPa to about −1100 MPa and the second layer comprises a residual stress from about −400 MPa to about −600 MPa.

\* \* \* \* \*